United States Patent
Tanaka

(10) Patent No.: US 9,041,487 B2
(45) Date of Patent: May 26, 2015

(54) SURFACE ACOUSTIC WAVE FILTER AND DUPLEXER USING SAME

(75) Inventor: Hiroyuki Tanaka, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 725 days.

(21) Appl. No.: 13/379,617

(22) PCT Filed: Jun. 25, 2010

(86) PCT No.: PCT/JP2010/060878
§ 371 (c)(1), (2), (4) Date: Dec. 20, 2011

(87) PCT Pub. No.: WO2010/150882
PCT Pub. Date: Dec. 29, 2010

(65) Prior Publication Data
US 2012/0098618 A1   Apr. 26, 2012

(30) Foreign Application Priority Data

Jun. 26, 2009 (JP) ................................. 2009-152688
Oct. 29, 2009 (JP) ................................. 2009-248902

(51) Int. Cl.
| | |
|---|---|
| H03H 9/72 | (2006.01) |
| H03H 9/64 | (2006.01) |
| H03H 9/00 | (2006.01) |
| H03H 9/02 | (2006.01) |

(52) U.S. Cl.
CPC ........... *H03H 9/0038* (2013.01); *H03H 9/6436* (2013.01); *H03H 9/0042* (2013.01); *H03H 9/02913* (2013.01); *H03H 9/725* (2013.01)

(58) Field of Classification Search
USPC ........... 333/133, 193–196; 310/313 B, 313 D
See application file for complete search history.

(56) References Cited

U.S. PATENT DOCUMENTS

| | | | | |
|---|---|---|---|---|
| 4,492,940 A | * | 1/1985 | Hikita | 333/194 |
| 4,647,881 A | * | 3/1987 | Mitsutsuka | 333/194 |
| 5,179,310 A | * | 1/1993 | Satoh et al. | 310/313 B |
| 5,568,002 A | * | 10/1996 | Kawakatsu et al. | 310/313 B |
| 6,583,691 B2 | * | 6/2003 | Takamine | 333/195 |
| 6,791,437 B2 | * | 9/2004 | Hagn et al. | 333/195 |

(Continued)

FOREIGN PATENT DOCUMENTS

| | | |
|---|---|---|
| JP | 55-79124 | 5/1980 |
| JP | 01-231417 | 9/1989 |

(Continued)

OTHER PUBLICATIONS

English language machine translation of JP 2004-235908 published Aug. 19, 2004, 11 pages.*

(Continued)

*Primary Examiner* — Barbara Summons
(74) *Attorney, Agent, or Firm* — Procopio, Cory, Hargreaves & Savitch, LLP

(57) ABSTRACT

An SAW filter and a duplexer excellent in electrical characteristics will be provided. An SAW filter has a piezoelectric substrate 40, a surface acoustic wave element 10 having a first IDT electrode 1 on the piezoelectric substrate 40, a first signal line 31 electrically connected to the first IDT electrode 1, and a ring-shaped reference potential line 9 which has a first intersecting portion intersecting with the first signal line 31 through an insulation member 41 and surrounds the surface acoustic wave element 10.

11 Claims, 15 Drawing Sheets

(56) References Cited

U.S. PATENT DOCUMENTS

| | | | |
|---|---|---|---|
| 6,985,048 B2 * | 1/2006 | Takamine et al. | 333/133 |
| 2004/0196119 A1 | 10/2004 | Shibahara et al. | 333/193 |
| 2005/0264375 A1 * | 12/2005 | Ikuta et al. | 333/133 |
| 2007/0018756 A1 | 1/2007 | Fujii et al. | 333/193 |
| 2007/0279156 A1 * | 12/2007 | Pitschi et al. | 333/193 |
| 2010/0045399 A1 * | 2/2010 | Yasuda | 333/25 |
| 2010/0194488 A1 * | 8/2010 | Yoshimoto | 333/100 |
| 2010/0207708 A1 * | 8/2010 | Haruta | 333/195 |
| 2010/0219912 A1 * | 9/2010 | Tanaka et al. | 333/195 |

FOREIGN PATENT DOCUMENTS

| | | | |
|---|---|---|---|
| JP | 04-091508 | | 3/1992 |
| JP | 04-281613 | * | 10/1992 |
| JP | 05-267990 | | 10/1993 |
| JP | 09162676 A | | 6/1997 |
| JP | 2000-261285 | | 9/2000 |
| JP | 2004-153580 | * | 5/2004 |
| JP | 2004-235908 | * | 8/2004 |
| JP | 2004-282707 | | 10/2004 |
| JP | 2007-142491 | | 6/2007 |
| JP | 2008-028825 | * | 2/2008 |
| WO | WO 2006/009021 A1 | | 1/2006 |
| WO | WO 2008/142905 | * | 11/2008 |
| WO | WO 2009/013974 | * | 1/2009 |
| WO | WO 2009/119016 | * | 10/2009 |

OTHER PUBLICATIONS

English language machine translation of JP 2000-261285 published Sep. 22, 2000, 3 pages.*
English language translation of Japanese office action dated Jun. 5, 2012 issued in corresponding Japanese application 2011519953.

* cited by examiner

SURFACE ACOUSTIC WAVE FILTER AND DUPLEXER USING SAME

CROSS-REFERENCE TO THE RELATED APPLICATIONS

This application is a national stage of international application No. PCT/JP2010/060878, filed on Jun. 25, 2010, and claims the benefit of priority under 35 USC 119 to Japanese Patent Application No. 2009-152688, filed on Jun. 26, 2009 and Japanese Patent Application No. 2009-248902, filed on Oct. 29, 2009, the entire contents of all of which are incorporated herein by reference.

TECHNICAL FIELD

The present invention relates to a surface acoustic wave filter and duplexer used in a mobile communication device etc.

BACKGROUND ART

Conventionally, in high frequency circuits of communication terminals such as mobile phones or the like, surface acoustic wave (hereinafter, sometimes abbreviated as "SAW") filters utilizing surface acoustic waves have been used. An SAW filter is used in a transmitting-use filter, receiving-use filter, duplexer, etc.

In recent years, SAW filters have been required to be increased in amount of attenuation, offer additional balance-unbalance conversion functions, and so on. The circuit configuration thereof is therefore becoming complicated as a general trend. In order to realize such a complex circuit, the technique of arranging lines so that lines having different potentials intersect with each other three-dimensionally is known (see for example Patent Literature 1, FIG. 9).

By employing such a three-dimensional line structure, a plurality of ground-use lines can be connected to a common ground terminal. Therefore, even an SAW filter having a complex circuit configuration can be reduced in size in its overall structure.

In the case of the conventional SAW filter explained above, however, an SAW element was easily influenced by spurious external electromagnetic waves and easily deteriorated in electrical characteristics. Further, the inductor component of the ground lines was apt to become larger. This also became a factor causing deterioration of the electrical characteristics.

The present invention was made in order to solve the above problem and provides an SAW filter and duplexer excellent in electrical characteristics.

Patent Literature 1: Japanese Patent Publication (A) No. 2007-142491

SUMMARY OF INVENTION

An SAW filter in one aspect of the present invention is provided with a piezoelectric substrate, a surface acoustic wave element which has a first IDT electrode which is located on the piezoelectric substrate, a first signal line which is electrically connected to the first IDT electrode, and a ring-shaped reference potential line which has a first intersecting portion which intersects with the first signal line through a first insulation member and surrounds the surface acoustic wave element.

Further, an SAW filter in another aspect of the present invention is provided with a piezoelectric substrate, a surface acoustic wave element which has a first IDT electrode which is located on the piezoelectric substrate and which has a first signal bus bar conductor and a first reference potential bus bar conductor and which has a second IDT electrode which is located on the piezoelectric substrate aligned with the first IDT electrode and which has a second signal bus bar conductor and a second reference potential bus bar conductor, a first signal line which is electrically connected to the first signal bus bar conductor, a second signal line which is electrically connected to the second signal bus bar conductor, and a ring-shaped reference potential line which is connected to the first and second reference potential bus bar conductors and which surrounds the surface acoustic wave element.

Further, a duplexer in one aspect of the present invention is a duplexer which is provided with a transmitting filter and a receiving filter, wherein at least one of the transmitting-use filter and receiving-use filter is comprised of the surface acoustic wave filter explained above.

According to the above SAW filter, the reference potential line is formed in a ring shape so as to surround the surface acoustic wave element, so the surface acoustic wave element becomes resistant to influence by spurious external electromagnetic waves. Further, the inductor component of the reference potential line can be made small. For this reason, an SAW filter excellent in electrical characteristics can be formed.

Further, if applying such a SAW filter to a duplexer, a duplexer excellent in electrical characteristics can be formed.

DESCRIPTION OF EMBODIMENTS

Below, embodiments of an SAW filter and duplexer according to the present invention are explained in detail with reference to the drawings. Note that the sizes of the patterns and the distances between patterns etc. are schematically shown and the invention is not limited to these.

<Surface Acoustic Wave Filter>
(First Embodiment)

Figure 1:
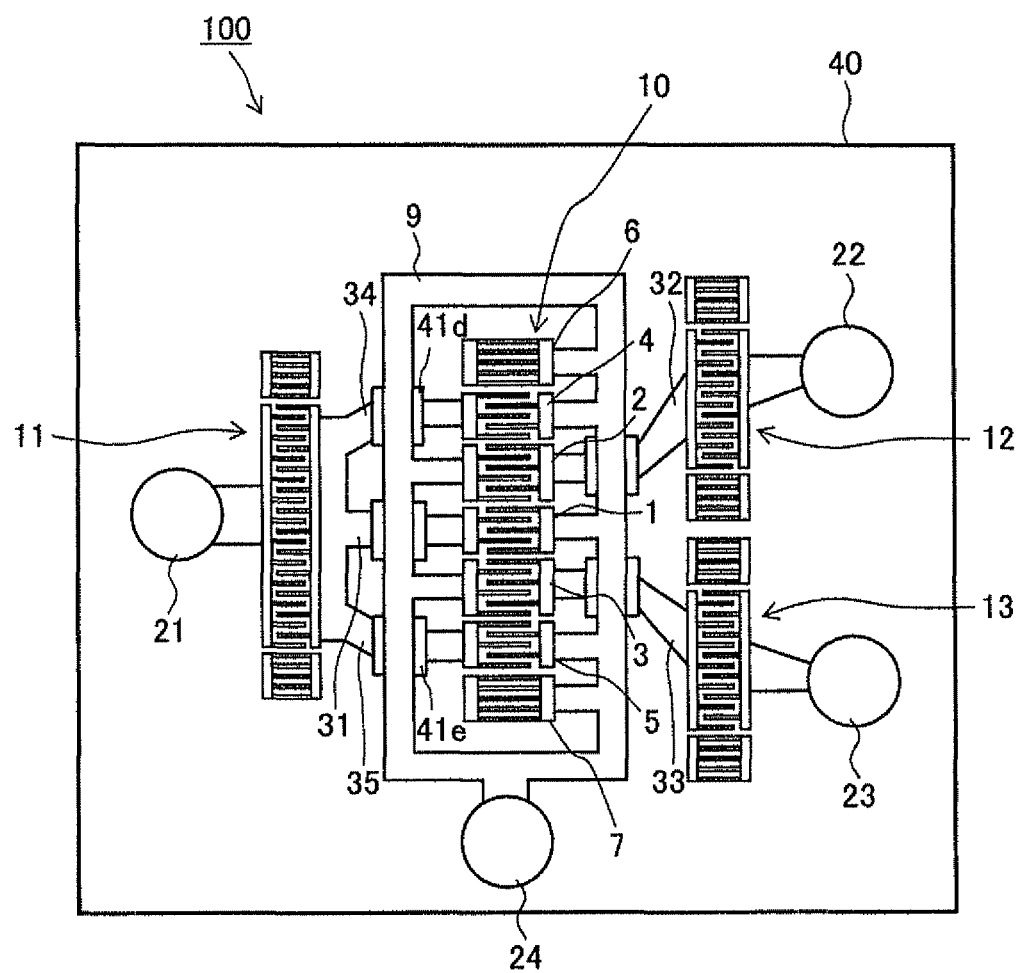
FIG. 1 A plan view of an SAW filter according to a first embodiment of the present invention.

FIG. 1 is a plan view of an SAW filter 100 according to a first embodiment. The SAW filter 100 of the present embodiment is used as a receiving bandwidth filter of Band 1 (transmitting bandwidth: 1920 to 1980 MHz, receiving bandwidth: 2110 to 2170 MHz) in a UMTS (Universal Mobile Telecommunications System) having a balance-unbalance conversion function.

As shown in FIG. 1, the SAW filter 100 according to the first embodiment has a piezoelectric substrate 40, an SAW element 10 arranged on the piezoelectric substrate, a ring-shaped reference potential line 9 formed to surround the SAW element 10, and SAW resonators 11, 12, and 13.

The piezoelectric substrate 40 is comprised of for example a 36°±3° rotated Y-cut, X-propagated lithium tantalate single crystal, 42°±3° rotated Y-cut, X-propagated lithium tantalate single crystal, 64°±3° rotated Y-cut, X-propagated lithium niobate single crystal, 41°±3° rotated Y-cut, X-propagated lithium niobate single crystal, or 45°±3° rotated X-cut, Z-propagated lithium tetraborate single crystal. These single crystals have large electromechanical coupling coefficients and small propagation loss of SAW, so are preferred as the piezoelectric substrate 40. Further, among these single crystals, when the SAW filter is formed by using a piezoelectric substrate 40 remarkably reduced in pyroelectricity by oxygen defects or solid solution of Fe etc., the result becomes excellent in reliability. The thickness of the piezoelectric substrate 40 is for example 0.1 to 0.5 mm, and the shape is a rectangular parallelepiped shape.

On the main surface of the piezoelectric substrate 40, IDT (Inter Digital Transducer) electrodes, signal lines, a reference potential line, terminals, etc. are disposed. These IDT electrodes etc. are formed by patterning a metal film such as an Al or the like.

The SAW element 10 is formed by five IDT electrodes 1 to 5 and two reflector electrodes 6 and 7 which are arranged on the main surface of the piezoelectric substrate 40. The IDT electrodes 1 to 5 are arranged side by side along the propagation direction of the SAW (up/down direction of the sheet surface), while the reflector electrodes 6 and 7 are arranged on the two sides of these. The SAW element 10 is a longitudinally coupled resonator type SAW filter element.

Among the five IDT electrodes 1 to 5, the IDT's 1, 4, and 5 are electrically connected to an unbalanced signal terminal 21. On the other hand, among the IDT electrodes, the IDT electrode 2 is electrically connected to a first balanced signal terminal 22, and the IDT electrode 3 is electrically connected to a second balanced signal terminal 23. In the present embodiment, the IDT electrodes 1 to 5 are formed so that, when a signal is input from the unbalanced signal terminal 21, the phase of the signal which is output from the first balanced signal terminal 22 is different by 180° from the phase of the signal which is output from the second balanced signal terminal 23. That is, the SAW element 10 has a balance-unbalance conversion function. Note that, the first and second balanced signal terminals 22 and 23 may be used as input-use terminals, and the unbalanced signal terminal 21 may be used as an output-use terminal as well.

Figure 2:
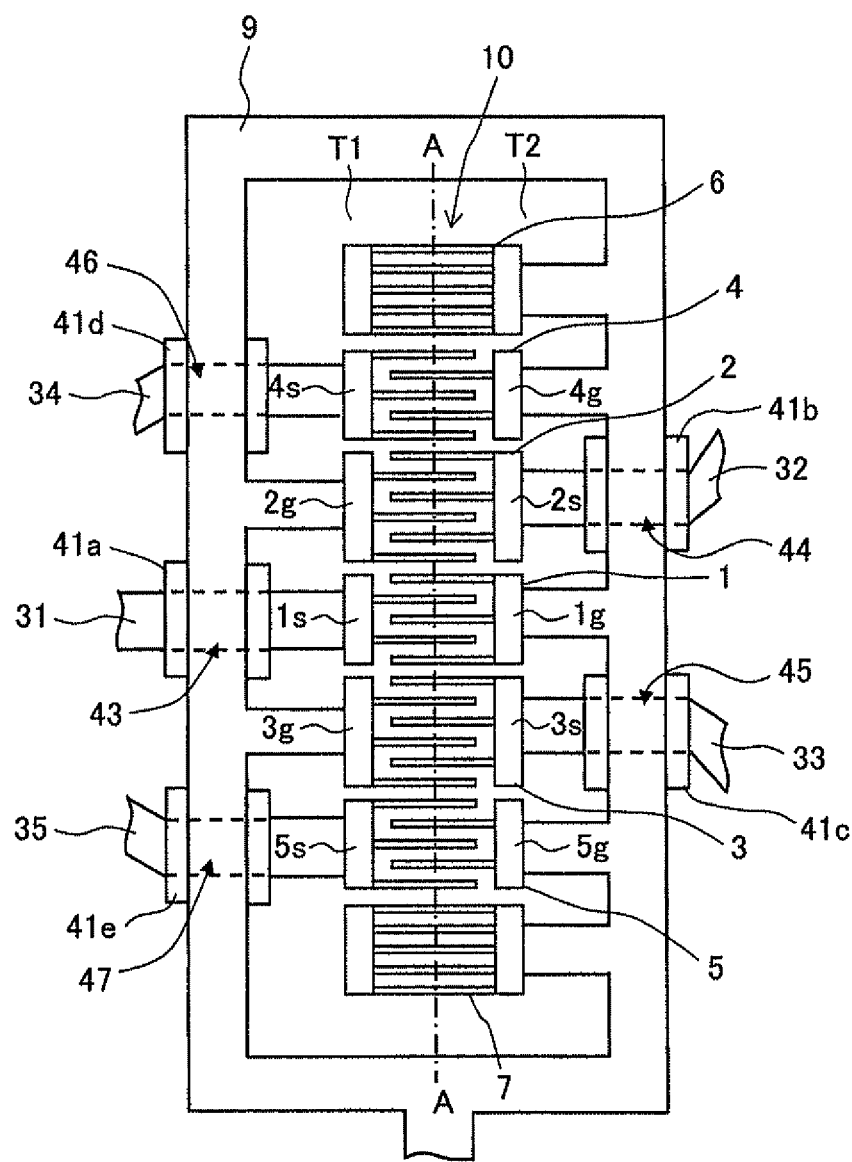
FIG. 2 An enlarged view of principal parts of the SAW filter shown in FIG. 1.

FIG. 2 is an enlarged plan view of a portion including the SAW element 10 and its peripheral lines. As shown in the same diagram, each of the IDT electrodes 1 to 5 has a plurality of electrode fingers which extend in a direction perpendicular to the propagation direction of the SAW. These pluralities of electrode fingers are connected to bus bar conductors. Here, the numbers of electrode fingers of the IDT electrodes 1, 2, 3, 4, and 5 are for example 37, 42, 57, 42, and 37. The numbers of electrode fingers of the reflector electrodes are for example 100. Further, an intersection width of the IDT electrodes 1 to 5 is for example 80 μm, and an electrode film thickness is for example 1600 Å.

The bus bar conductors which are connected to the electrode fingers of the IDT electrodes include two types. The first types are signal-use bus bar conductors (1s to 5s), and the other types are reference potential-use bus bar conductors (1g to 5g).

The ring-shaped reference potential line 9 is formed on the piezoelectric substrate 40 so as to surround the SAW element 10 including the IDT electrodes 1 to 5 and reflector electrodes 6 and 7. The term "ring-shaped" referred to here includes not only a circular shape, but also a polygonal shape having corner portions as shown in FIG. 1 etc. The reference potential line 9 is connected to a ground terminal 24 as shown in FIG. 1 and is retained at the ground potential at the time of use of the SAW filter 100. The number of ground terminal connected to the reference potential line 9 may be one as shown in FIG. 1 or several. Note that, the ground potential is not necessarily zero volt (0V).

Here, when paying attention to the IDT electrode 1, the signal-use bus bar conductor 1s of the IDT electrode 1 is connected to a signal line 31. On the other hand, the reference potential bus bar conductor 1g of the IDT electrode 1 is connected to the reference potential line 9.

The signal line 31 connected to the signal-use bus bar conductor 1s three-dimensionally intersects the ring-shaped reference potential line 9 with a first insulation member 41a which is interposed therebetween and is made of SiO$_2$ or the like (hereinafter, sometimes the first to fifth insulation members are not differentiated, but are simply referred to as the "insulation members 41"). In the present embodiment, the signal line 31 is arranged under the first insulation member 41a, and the reference potential line 9 is arranged over the first insulation member 41a. In FIG. 2, the signal line 31 passing under the first insulation member 41a is indicated by a broken line. That is, a portion, where the portion of the signal line 31 indicated by the broken line and the reference potential line 9 intersect, becomes an intersecting portion 43. Note that, the upper and lower positional relationship between the signal line 31 and the reference potential line 9 in the intersecting portion 43 may be reverse as well. That is, in the intersecting portion, the reference potential line 9 may be arranged under the first insulation member 41a, and the signal line 31 may be arranged over the first insulation member 41a as well. However, the upper and lower position relationship between the reference potential line 9 and the signal line in the intersecting portion is preferably made the same in all intersecting portions 43 to 47. For example, as shown in FIG. 2, in the intersecting portion 43, when the signal line 31 is arranged under the first insulation member 41a, and the reference potential line 9 is arranged over the first insulation member 41a, in the intersecting portions 44 to 47 other than that as well, the positional relationships are preferably made so that the signal line is arranged under the insulation member and the reference potential line 9 is arranged over the insulation member 41. Due to this, it becomes easy to form the entire reference potential line 9 by a single material, so the production efficiency is good. Further, there is also the advantage that a filter insertion loss can be made smaller compared with a case where a different type material is added in the middle of the reference potential line 9.

As shown in FIG. 1 and FIG. 2, the reference potential line 9 is formed so as to surround the entire SAW element 10, therefore the influence of electromagnetic noise from the outside upon the SAW element 10 is reduced by an electromagnetic shield effect by the reference potential line 9. As a result, an SAW filter having stable electrical characteristics can be formed. Further, the structure becomes one where heat is efficiently dissipated by the reference potential line 9 even in a case where the heat is propagated to the SAW element 10, therefore fluctuation of the filter characteristics due to heat can be suppressed. Further, by improvement of heat radiation, the power endurance of the SAW element 10 improves, and breakage of electrode fingers can be suppressed. In particular, a longitudinally coupled multimode type surface acoustic wave filter which is frequently used as the receiving bandwidth filter of a duplexer has problems that the voltage endurance is low and electrode fingers are easily broken. However, if the SAW filter 100 of the present embodiment is used as this longitudinally coupled multimode type surface acoustic wave filter, the breakage of electrode fingers can be suppressed, and a duplexer having a high reliability in electrical characteristics can be formed.

Next, attention is paid to the IDT electrode 2. The signal-use bus bar conductor 2s of the IDT electrode 2 is connected to the signal line 32. This signal line 32 three-dimensionally intersects with the reference potential line 9 with the second insulation member 41b interposed therebetween in the same way as the signal line 31. That is, the portion at which the reference potential line 9 intersects with the signal line 32 is the intersecting portion 44. On the other hand, the reference potential-use bus bar conductor 2g of the IDT electrode 2 is connected to the reference potential line 9.

Each of the reference potential-use bus bar conductors 1g and 2g of the IDT electrode 1 and IDT electrode 2 is connected to the ring-shaped reference potential line 9 which surrounds the IDT electrode 1 and IDT electrode 2. By employing such a connection configuration, the entire inductor up to the ground terminal 24 can be reduced, and the attenuation characteristic of the SAW filter 100 can be improved.

Figure 3A:
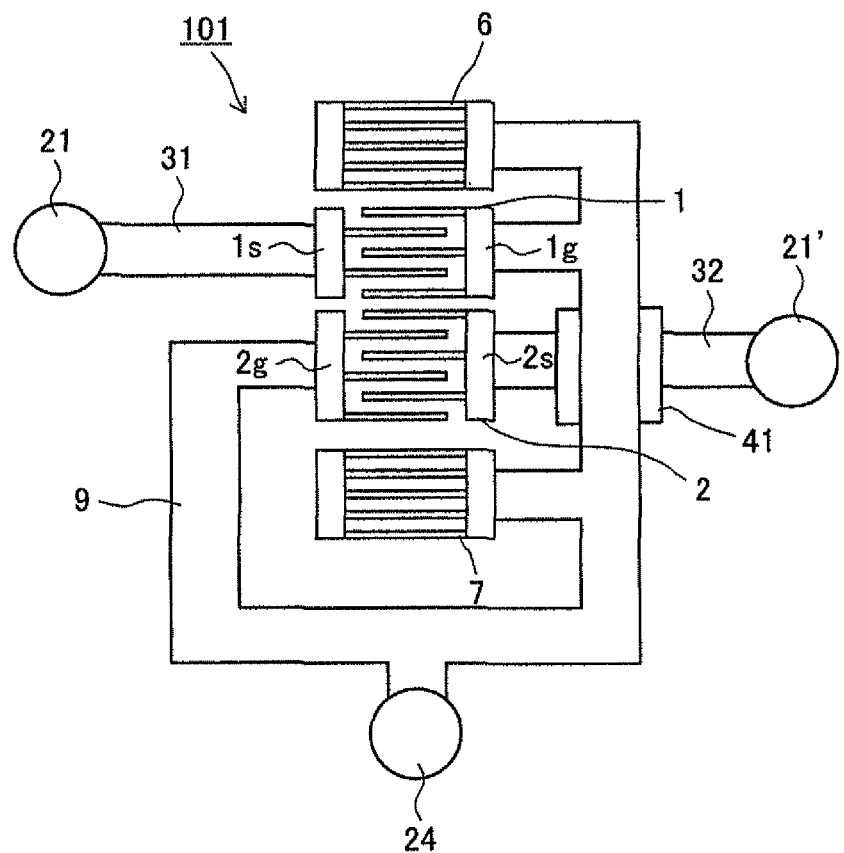
FIG. 3 Views showing an SAW filter of a comparative example, in which A is a plan view, and B is an equivalent circuit diagram.
Figure 3B:
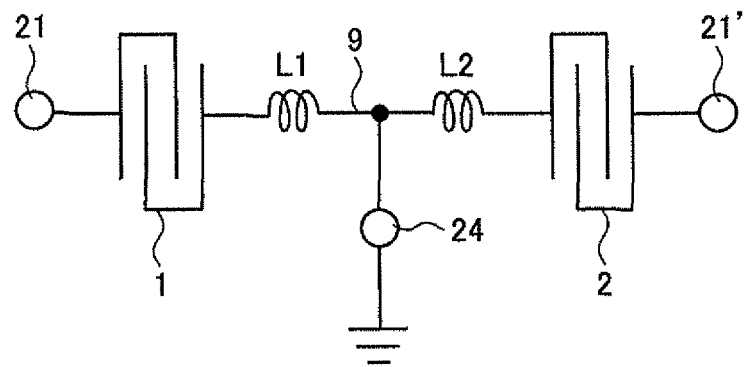
Figure 4A:
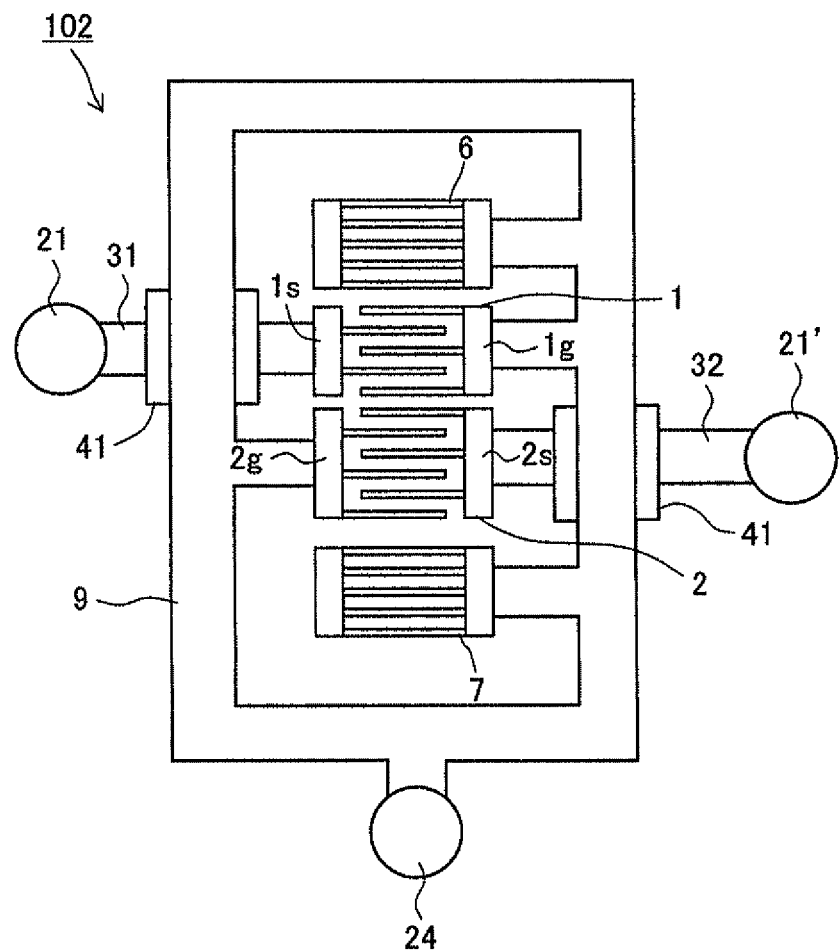
FIG. 4 Views for explaining the effects of the SAW filter shown in FIG. 1, in which A is a plan view, and B is an equivalent circuit diagram.

The principle by which the entire inductor can be made smaller in the SAW filter 100 according to the present embodiment is explained by using FIG. 3 and FIG. 4. FIG. 3 shows an SAW filter 101 as a comparative example in which the reference potential line to which the reference potential-use bus bar conductors of the IDT electrodes are connected does not become ring-shaped, in which A is a schematic plan view of the SAW filter 101, and B is an equivalent circuit diagram of the SAW filter 101. On the other hand, FIG. 4 shows an SAW filter 102 in which the reference potential line to which the reference potential-use bus bar conductors of the IDT electrodes are connected becomes ring-shaped, in which A is a schematic plan view of the SAW filter 102, and B is an equivalent circuit diagram of the SAW filter 102. Note that, for facilitating the explanation, in FIG. 3 and FIG. 4, unbalance-unbalance type SAW filters each being comprised of two IDT electrodes are shown.

In the SAW filter 101 shown in FIG. 3, there are an inductor L1 and an inductor L2 in the routes from the individual IDT electrodes 1 and 2 via the reference potential line 9 up to the ground terminal 24. Here, the inductor L1 is the inductor by the reference potential line 9 from the reference potential-use bus bar conductor 1g of the IDT electrode 1 up to the ground terminal 24, and the inductor L2 is the inductor by the reference potential line 9 from the reference potential-use bus bar conductor 2g of the IDT electrode 2 up to the ground terminal 24.

Figure 4B:
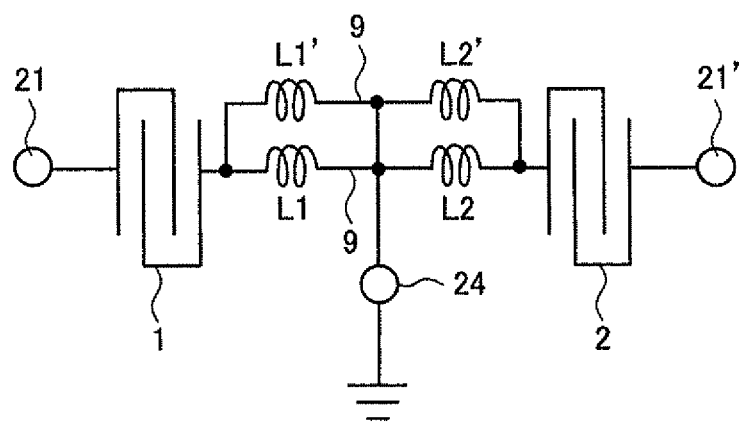

Contrary to this, in the case of the SAW filter 102 shown in FIG. 4, an inductor L1' and an inductor L2' are added parallel to the inductors L1 and L2 explained before respectively (see FIG. 4B). Here, the inductor L1' is the inductor by the reference potential line 9 which runs from the reference potential-use bus bar conductor 1g of the IDT electrode 1 counterclockwise along the reference potential line 9 up to the ground terminal 24, while the inductor L2' is the inductor by the reference potential line 9 which runs from the reference potential-use bus bar conductor 2g of the IDT electrode 2 clockwise along the reference potential line 9 up to the ground terminal 24. By forming the reference potential line 9 in a ring shape, these inductors L1' and L2' are added parallel to the originally existing inductors L1 and L2, therefore the overall inductors become smaller in the SAW filter 102 than in the SAW filter 101.

If the inductors up to the ground terminal 24 become small in this way, the voltage induced by the inductors becomes small, therefore the backward flow of the current generated in the reference potential line 9 (hereinafter also referred to as the "ground current") becomes small. When the backward flow of the ground current becomes small in this way, the amount of attenuation at the outside of the pass band can be made larger, so the result becomes an SAW filter excellent in electrical characteristics. Further, the inductor between the IDT electrode 1 and the IDT electrode 2 becomes small as well, therefore the spurious ground current generated based on this inductor can be suppressed, and the amount of attenuation of outside of the pass band can be made larger by this as well.

Note that, in the figure, the explanation was given of the case where the signal lines 31 and 32 were led out in reverse directions (left direction and right direction on the sheet surface). However, even when the signal lines 31 and 32 are led out in the same direction, the result becomes the same equivalent circuit, so exhibits the same effects.

Returning to FIG. 2 and paying attention to the IDT electrode 3, the signal-use bus bar conductor 3s of the IDT electrode 3 is connected to the signal line 33. This signal line 33 three-dimensionally intersects with the reference potential line 9 with the third insulation member 41c interposed therebetween. The portion at which the reference potential line 9 intersects with the signal line 33 is the intersecting portion 45. On the other hand, the reference potential-use bus bar conductor 3g of the IDT electrode 3 is connected to the reference potential line 9.

In the present embodiment, the IDT electrodes 1 to 3 and the bus bar conductors of the IDT electrodes are arranged so as to satisfy predetermined conditions. Specifically, the IDT electrode 1 is arranged between the IDT electrode 2 and the IDT electrode 3 first. That is, among the IDT electrodes 1 to 3, the IDT electrode 1 is arranged at the center, the IDT electrode 2 is arranged on one side of that, and the IDT electrode 3 is arranged on the other side. Further, the IDT electrodes 1 to 3 are arranged in such a manner that, when bisecting the inside of the reference potential line 9 along a line A-A parallel to the propagation direction of the SAW, the signal-use bus bar conductor 1s of the IDT electrode 1, the reference potential-use bus bar conductor 2g of the IDT electrode 2, and the reference potential-use bus bar conductor 3g of the IDT electrode 3 are located in one region (first region T1), and the reference potential-use bus bar conductor 1g of the IDT electrode 1, the signal-use bus bar conductor 2s of the IDT electrode 2, and the signal-use bus bar conductor 3s of the IDT electrode 3 are located in another region (second region T2).

Under such an arrangement, by connecting the reference potential-use bus bar conductors 1g, 2g, and 3g of the IDT electrodes 1 to 3 to the ring-shaped reference potential line 9, the generation of a spurious ground current in the reference potential line 9 is suppressed, and the out-of-band attenuation can be greatly improved.

Figure 5:
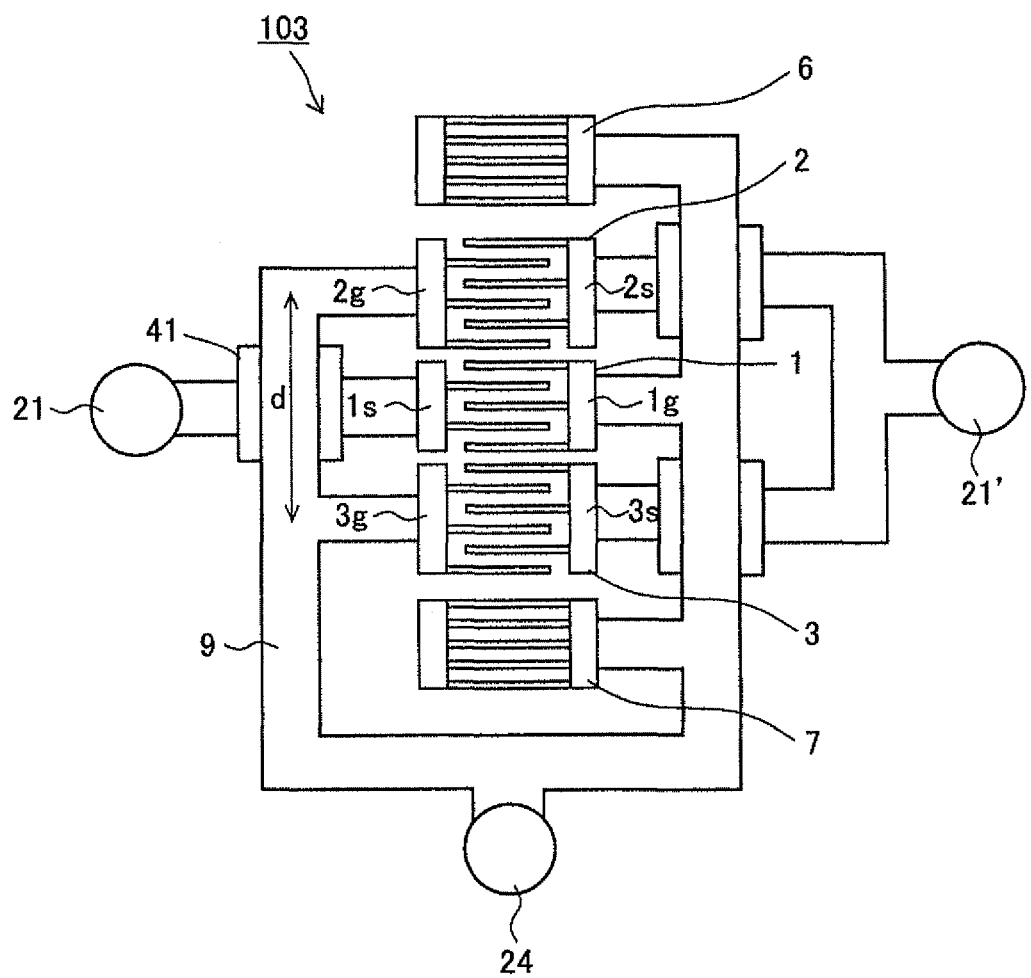
FIG. 5 is a plan view of a SAW filter of a comparative example.
Figure 6:
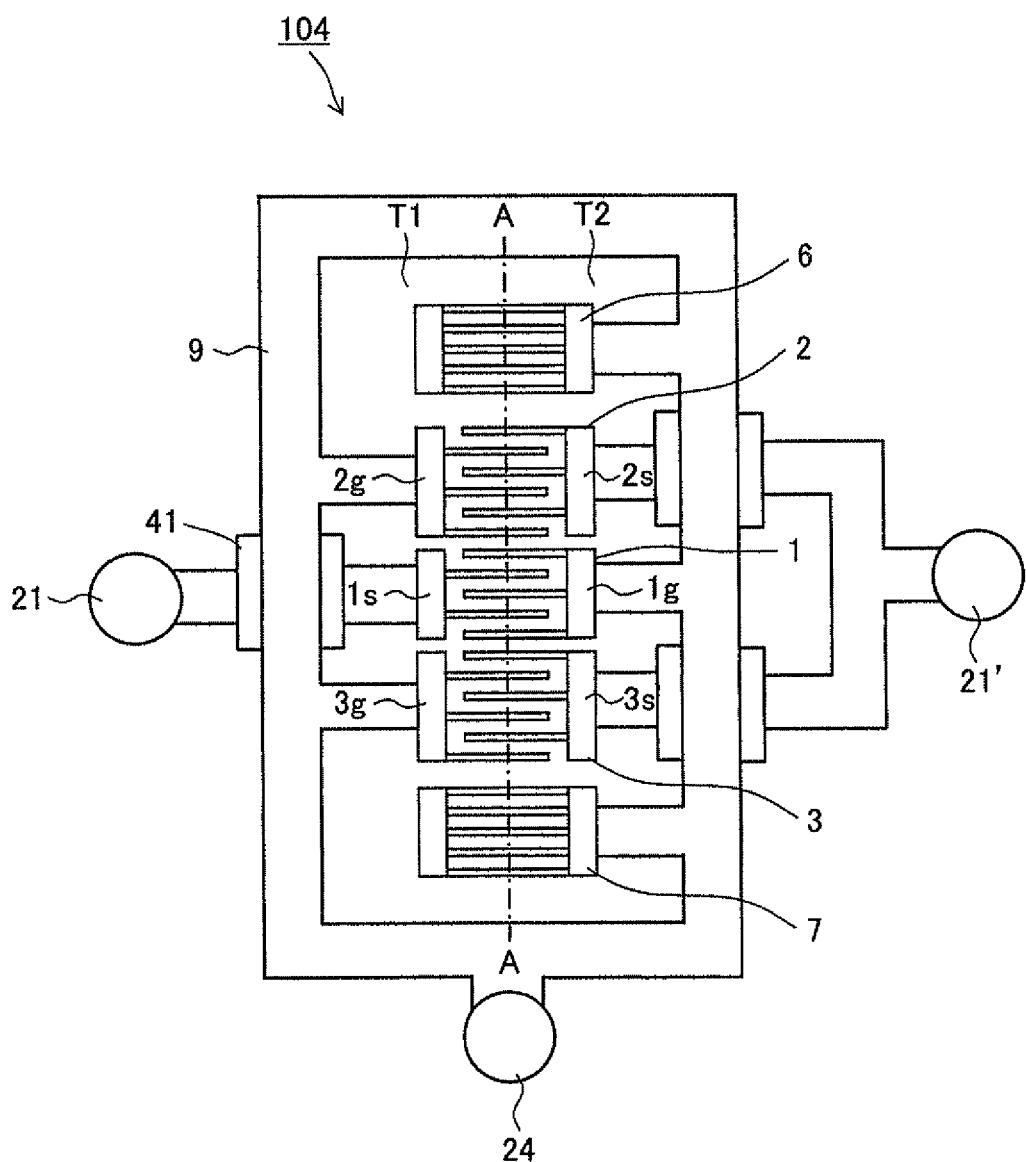
FIG. 6 is a plan view of an embodiment of a SAW filter.

The principle by which the generation of ground current can be suppressed is explained by using FIG. 5 and FIG. 6. FIG. 5 is a schematic plan view of an SAW filter 103 as a comparative example in which the reference potential line to which the reference potential-use bus bar conductor of the IDT electrode is connected does not become ring-shaped. FIG. 6 is a schematic plan view of an SAW filter 104 in which the reference potential line to which the reference potential-use bus bar conductor of the IDT electrode is connected becomes ring-shaped. The SAW filter 103 and the SAW filter 104 are same in conditions other than the reference potential lines. Note that, for facilitating the explanation, in FIG. 5 and FIG. 6, the filters are formed as unbalance-unbalance type SAW filters each configured by three IDT electrodes.

In the case of the SAW filter 103 shown in FIG. 5, there is a difference of the "d" shown in the figure between the length of the reference potential line 9 from the reference potential-use bus bar conductor 1g of the IDT electrode 1 along the reference potential line 9 up to the reference potential-use bus bar conductor 2g of the IDT electrode 2 and the length of the reference potential line 9 from the reference potential-use bus bar conductor 1g of the IDT electrode 1 along the reference potential line 9 up to the reference potential-use bus bar conductor 3g of the IDT electrode 3. In this case, when a signal flows in the SAW filter 103, an inductor component based on the difference "d" of line lengths is generated. A difference arises between the potential when viewing the reference potential-use bus bar conductor 2g from the reference potential-use bus bar conductor 1g and the potential when viewing the reference potential-use bus bar conductor 3g from the reference potential-use bus bar conductor 1g. Then, based on this potential difference, a spurious ground current is generated in the reference potential line 9. This becomes noise and causes deterioration of the out-of-band attenuation.

On the other hand, in the case of the SAW filter 104 shown in FIG. 6, the reference potential line 9 to which the reference potential-use bus bar conductors are connected is formed in a loop. Therefore, when considering the two routes clockwise and counterclockwise from the reference potential-use bus bar conductor 1g, the potential difference based on the above difference "d" is cancelled, therefore the generation of spurious ground current can be suppressed. As a result, the generation of noise in the reference potential line 9 is suppressed, the out-of-band attenuation can be made large, and an SAW filter excellent in electrical characteristics can be formed.

The SAW filter 100 of the present embodiment is further provided with an IDT electrode 4 and an IDT electrode 5. A signal-use bus bar conductor 4s of the IDT electrode 4 is connected to a signal line 34. This signal line 34 three-dimensionally intersects with the reference potential line 9 with a fourth insulation member 41d interposed therebetween. On the other hand, a reference potential-use bus bar conductor 4g of the IDT electrode 4 is connected to the reference potential line 9. A signal-use bus bar conductor 5s of the IDT electrode 5 is connected to a signal line 35. This signal line 35 three-dimensionally intersects with the reference potential line 9 with a fifth insulation member 41e interposed therebetween. On the other hand, a reference potential-use bus bar conductor 5g of the IDT electrode 5 is connected to the reference potential line 9. Further, the reflector electrodes 6 and 7 are connected at their one bus bar conductors to the reference potential line 9.

The signal lines 31, 34, and 35 which are connected to the signal-use bus bar conductors 1s, 4s, and 5s of the IDT electrodes 1, 4, and 5 are connected through the SAW resonator 11 to the unbalanced signal terminal 21. By providing the SAW resonator 11, adjustment of impedance matching, improvement of electrostatic withstand voltage of the SAW element 10, improvement of the out-of-pass band attenuation due to the formation of attenuation poles, and so on become possible.

Further, the signal line 32 connected to the signal-use bus bar conductor 2s of the IDT electrode 2 is connected through the SAW resonator 12 to the balanced signal terminal 22, while the signal line 33 connected to the signal-use bus bar conductor 3s of the IDT electrode 3 is connected through the SAW resonator 13 to the balanced signal terminal 23. The SAW resonators 12 and 13 are, in the same way as the SAW resonator 11, for adjustment of impedance matching, improvement of electrostatic withstand voltage of the SAW element 10, improvement of the out-of-pass band attenuation due to the formation of attenuation poles, and so on.

Figure 16:
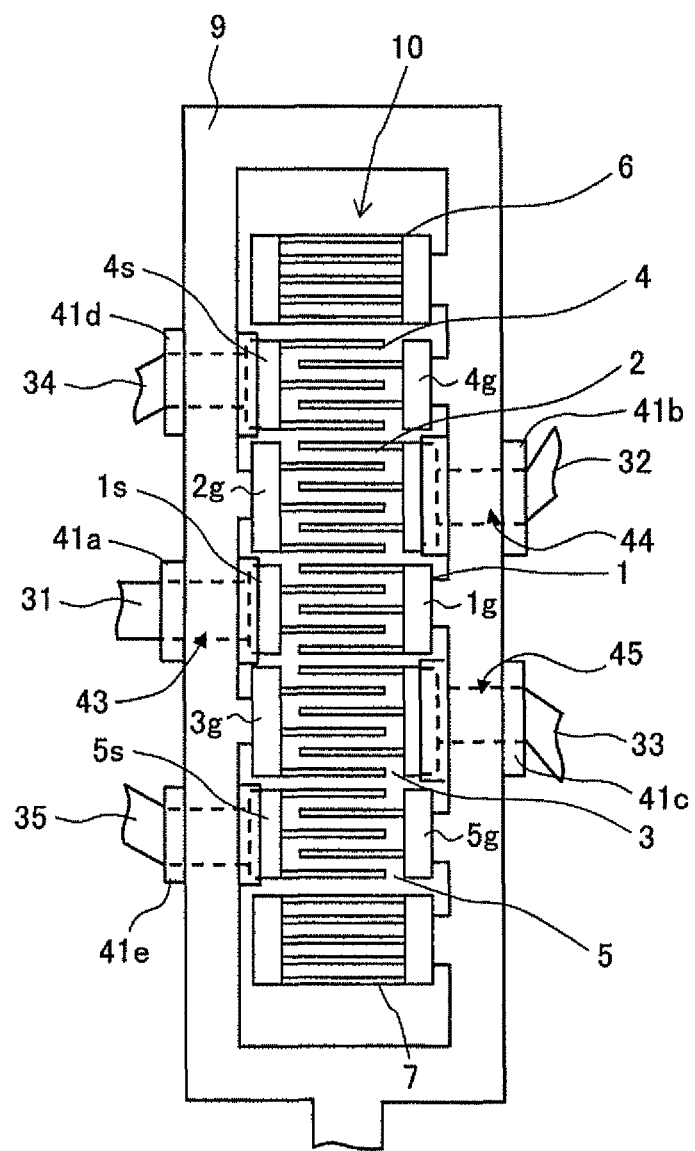
FIG. 16 An enlarged view of principal parts of a modification of the SAW filter shown in FIG. 1.

FIG. 16 shows a modification of the SAW filter 100 of the first embodiment and is an enlarged plan view of a portion including the SAW 10 and its peripheral lines.

The SAW filter 100 of this modification is one in which the positions of the insulation members 41 for forming three-dimensional intersecting portions are changed. Specifically, the insulation members 41 are arranged so as to be laid over the bus bar conductors which are connected to the lines passing under that insulation members 41. For example, when paying attention to the IDT electrode 1, the first insulation member 41a for making the signal line 31 which is connected to the signal-use bus bar conductor 1s of the IDT electrode 1 three-dimensionally intersect with the reference potential line 9 is partially laid over the signal-use bus bar conductor 1s. By arranging the insulation members 41 in this way, the reference potential line 9 can be brought close to the IDT electrodes. Therefore, the dead space formed between the reference potential line 9 and an IDT electrodes can be reduced, and consequently the SAW filter 100 can be reduced in size. Note that, this modification may be applied to the SAW filters of the other embodiments explained below as well.

(Second Embodiment)

Figure 7:
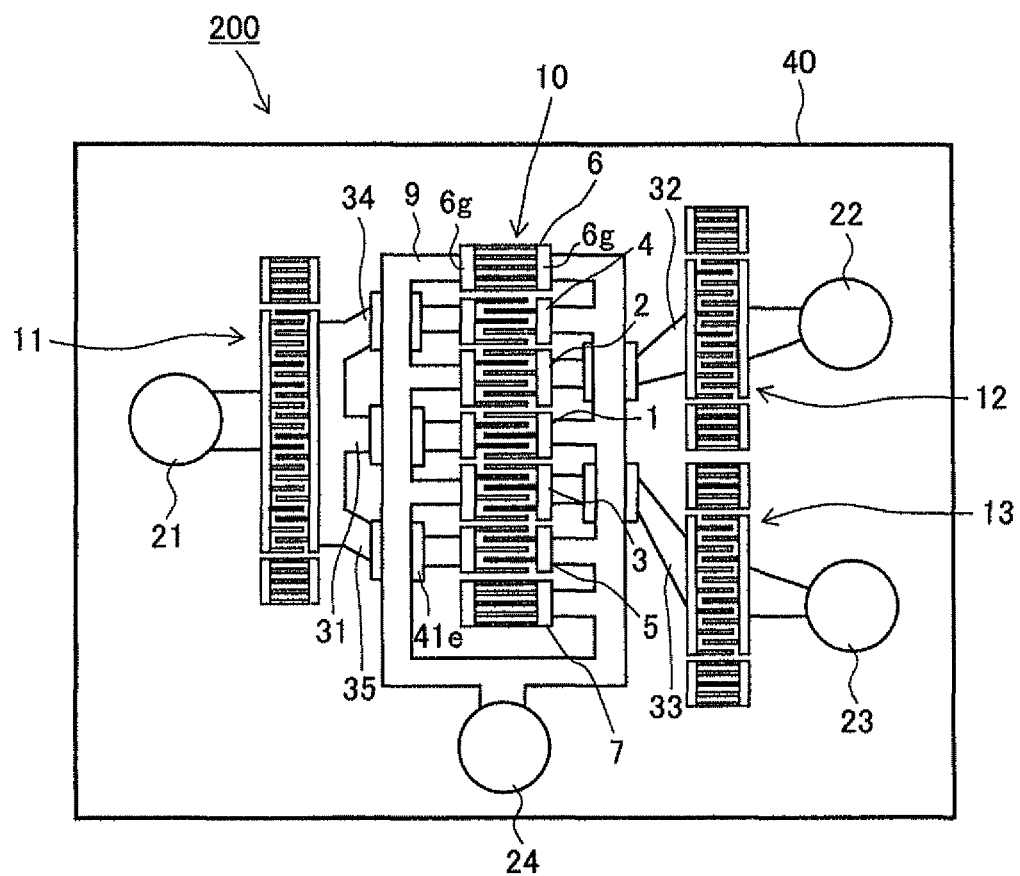
FIG. 7 A plan view of an SAW filter according to a second embodiment.

FIG. 7 is a plan view of an SAW filter 200 according to a second embodiment. In the SAW filter 200, the reference potential line 9 becomes ring-shaped through the reflector electrode 6. In other words, the reflector electrode 6 is inserted at a portion of the reference potential line 9. The reflector electrode 6 has two reference potential-use bus bar conductors 6g. The reference potential line 9 is connected to each of the reference potential-use bus bar conductors 6g. Further, the two ends of each of the electrode fingers arranged between the two reference potential-use bus bar conductors 6g are individually connected to the reference potential-use bus bar conductors 6g.

By forming the reference potential line 9 in a ring shape through the reflector electrode 6 in this way, it is not necessary to lay the reference potential line 9 up to the outside of the reflector electrode 6, therefore the SAW filter 200 can be formed smaller by that amount. FIG. 7 exhibits a structure inserting only one reflector electrode 6 into the reference potential line 9, but a structure inserting another reflector electrode 7 into the reference potential line 9 may be employed as well. That is, the reference potential line 9 may be formed ring-shaped through the reflector electrode 6 and reflector electrode 7 as well. Due to this, the SAW filter 200 can be reduced in size even more.

Further, by formation of the ring shape through the reflector electrode 6, compared with the case where the reference potential line 9 is laid at the outside of the reflector electrode 6, the distance between the reference potential-use bus bar conductors of the IDT electrodes 2 and 3 and the reference potential-use bus bar conductors of the IDT electrodes 1, 4, and 5 through the reference potential line 9 becomes small, whereby the inductors among those become smaller. Accordingly, there is also the advantage that spurious ground current generated based on the inductors among those can be suppressed and attenuation outside of the pass band can be made larger.

Note that, the same component portions as those of the SAW filter 100 shown in FIG. 1 are given the same reference notations and explanations thereof are omitted.

(Third Embodiment)

Figure 8:
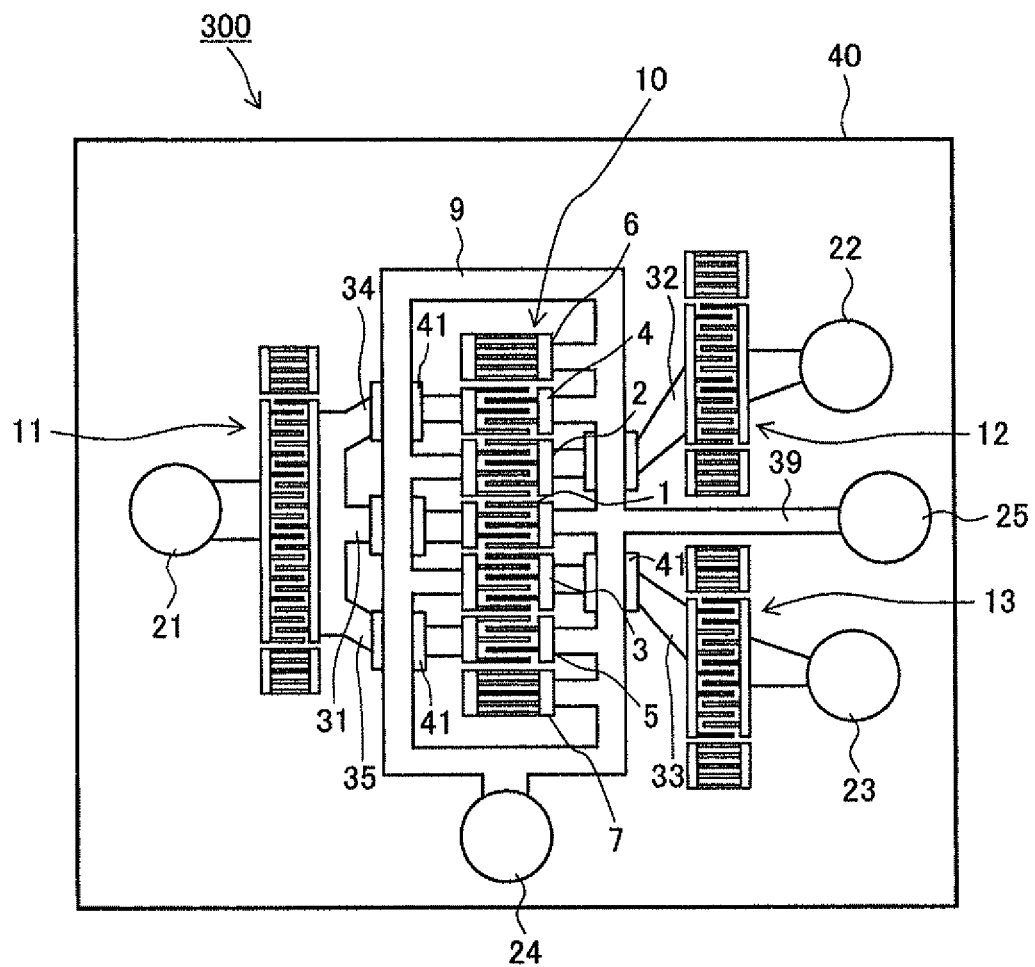
FIG. 8 A plan view of an SAW filter according to a third embodiment.

FIG. 8 is a plan view of an SAW filter 300 according to a third embodiment. In the SAW filter 300, a branched line 39 is formed. The branched line 39 is connected at one end to the reference potential line 9 and connected at the other end to the ground terminal 25. Further, the branched line 39 is arranged between the signal line 32 and the signal line 33.

By providing such a branched line 39, the current flowing in the reference potential line 9 is divided, therefore the amount of the current flowing in the reference potential line 9 becomes smaller by that amount. As a result, the voltage induced by the inductance of the reference potential line 9 becomes smaller, therefore the backward flow of the ground current is suppressed as well and the out-of-band attenuation can be greatly improved. Further, due to the arrangement of the branched line 39 between the signal line 32 leading to the output-use terminal and the signal line 33 leading to the output-use terminal in the same way, the majority of the return route of the ground current with respect to the currents of the output signals flowing in the signal line 32 and signal line 33 becomes the branched line 39 in the vicinity of the signal line 32 and signal line 33. Therefore, interference between the ground current with respect to the currents of the output signals and the ground current with respect to the currents of the input signals flowing in the signal lines 31, 34, and 35 which are connected to the input-use terminal can be suppressed, and the out-of-band attenuation can be greatly improved.

(Fourth Embodiment)

Figure 9:
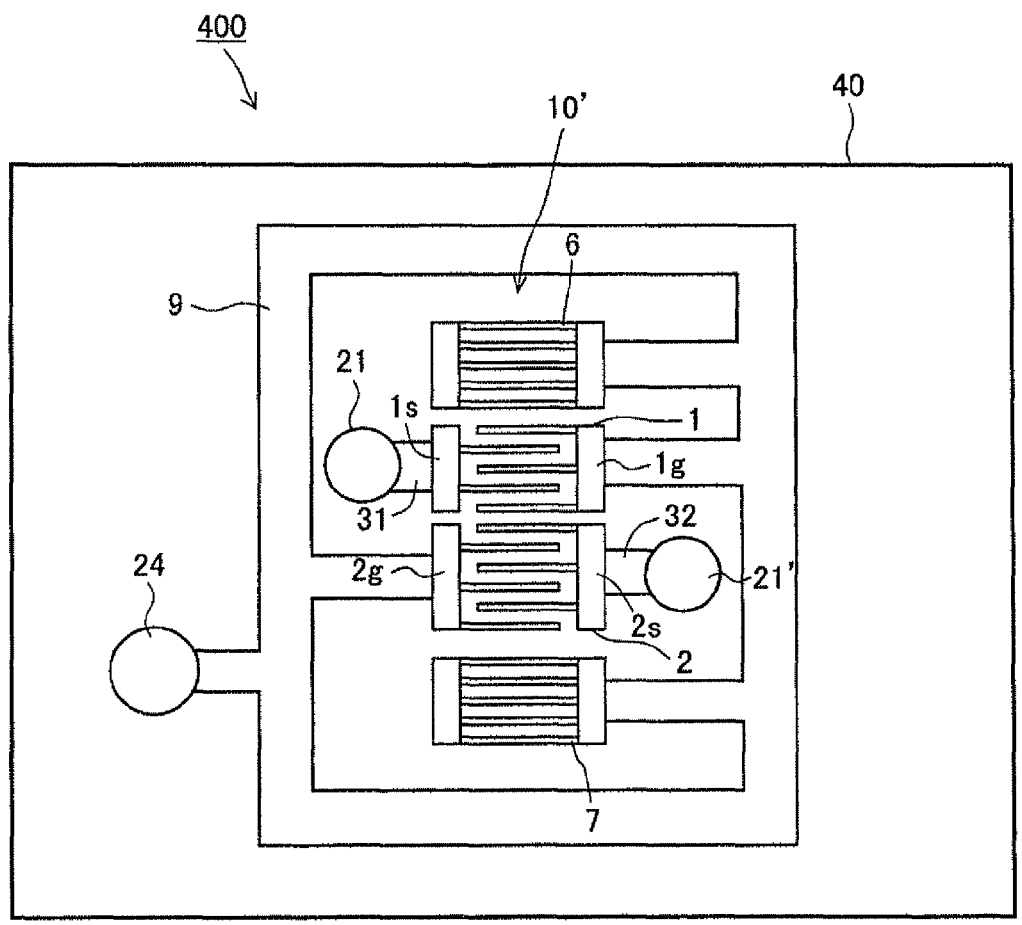
FIG. 9 A plan view of an SAW filter according to a fourth embodiment.

FIG. 9 is a plan view of an SAW filter 400 according to a fourth embodiment. The SAW filter 400 is provided with an SAW element 10'. The SAW element 10' is configured by two IDT electrodes 1 and 2 and two reflector electrodes 6 and 7 arranged at the two sides thereof.

The IDT electrode 1 has a signal-use bus bar conductor 1s and a reference potential-use bus bar conductor 1g. The signal-use bus bar conductor 1s is connected to the signal line 31, while the reference potential-use bus bar conductor 1g is connected to the reference potential line 9. Further, the IDT electrode 2 has a signal-use bus bar conductor 2s and a reference potential-use bus bar conductor 2g. The signal-use bus bar conductor 2s is connected to the signal line 32, while the reference potential-use bus bar conductor 2g is connected to the reference potential line 9. The reference potential line 9 is made ring-shaped so as to surround the SAW element 10'.

The SAW filter 400 is an unbalance-unbalance type SAW filter and has an unbalanced signal terminal 21 and an unbalanced signal terminal 21'. The unbalanced signal terminals 21 and 21' are arranged inside of the frame of the reference potential line 9. Therefore, the SAW filter 400 exhibits a structure not having three-dimensional lines as in the SAW filter 100.

The SAW filter 400 becomes an SAW filter which has a large out-of-pass band attenuation and is excellent in electrical characteristics since the overall inductors can be kept small for the same reason as explained by using FIG. 3 and FIG. 4.

(Fifth Embodiment)

Figure 10:
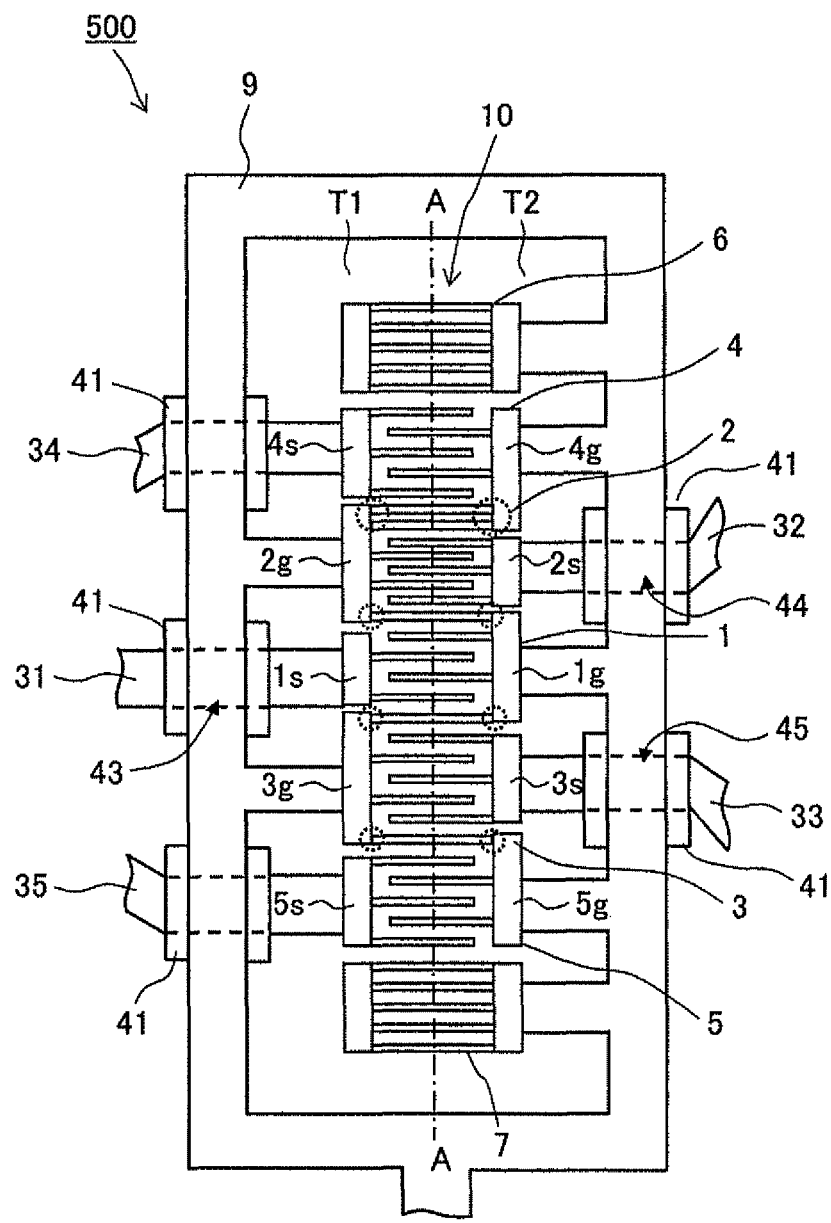
FIG. 10 A plan view of an SAW filter according to a fifth embodiment.

FIG. 10 is a plan view of an SAW filter 500 according to a fifth embodiment. The SAW filter 500 exhibits a structure where, between adjacent IDT electrodes, the reference potential-use bus bar conductor of one IDT electrode and the reference potential-use bus bar conductor of the other IDT electrode are connected through electrode fingers (in the figure, portions surrounded by dotted circles). For example, when paying attention to the IDT electrode 1 and IDT electrode 3, the electrode finger which is connected to the reference potential-use bus bar conductor 1g of the IDT electrode 1 is connected to the reference potential-use bus bar conductor 3g of the IDT electrode 3 as well.

Figure 11A:
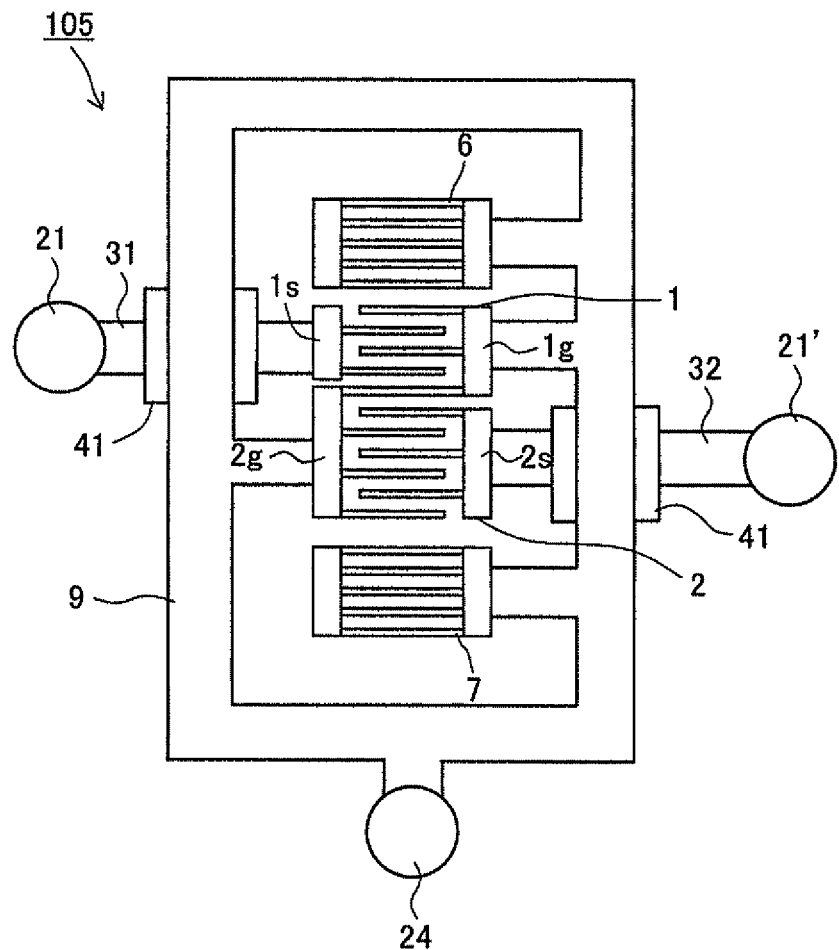
FIG. 11 Views for explaining the effects of the SAW filter shown in FIG. 10, in which A is a plan view, and B is an equivalent circuit diagram.
Figure 11B:
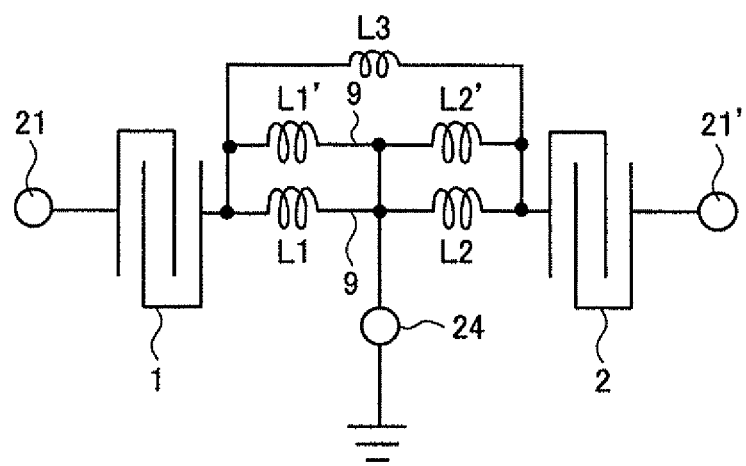

By employing such a structure, the attenuation characteristics of the SAW filter 500 can be improved more. This is explained by using FIG. 11. FIG. 11A is a plan view of an SAW filter 105 in a case where the SAW filter 500 is simplified in the same way as FIG. 4, and FIG. 11B is an equivalent circuit diagram of the SAW filter 105.

The SAW filter 105 has the reference potential-use bus bar conductor 1g of the IDT electrode 1 and the reference potential-use bus bar conductor 2g of the IDT electrode 2 connected through the electrode finger. In this case, by the electrode finger connecting the reference potential-use bus bar conductors 1g and 2g, as shown in FIG. 11B, an inductor L3 is added parallel with respect to the inductors L1, L1', L2, and L2'. Accordingly, the overall size of the inductors becomes smaller, and as explained also in the first embodiment, the voltage which is induced based on the inductors generated in the reference potential line 9 from the reference potential-use bus bar conductors up to the ground terminal 24 becomes smaller. As a result, the backward flow of the ground current generated in the reference potential line 9 becomes smaller, and the out-of-pass band attenuation can be made larger.

<Branching Filter>

Figure 12:
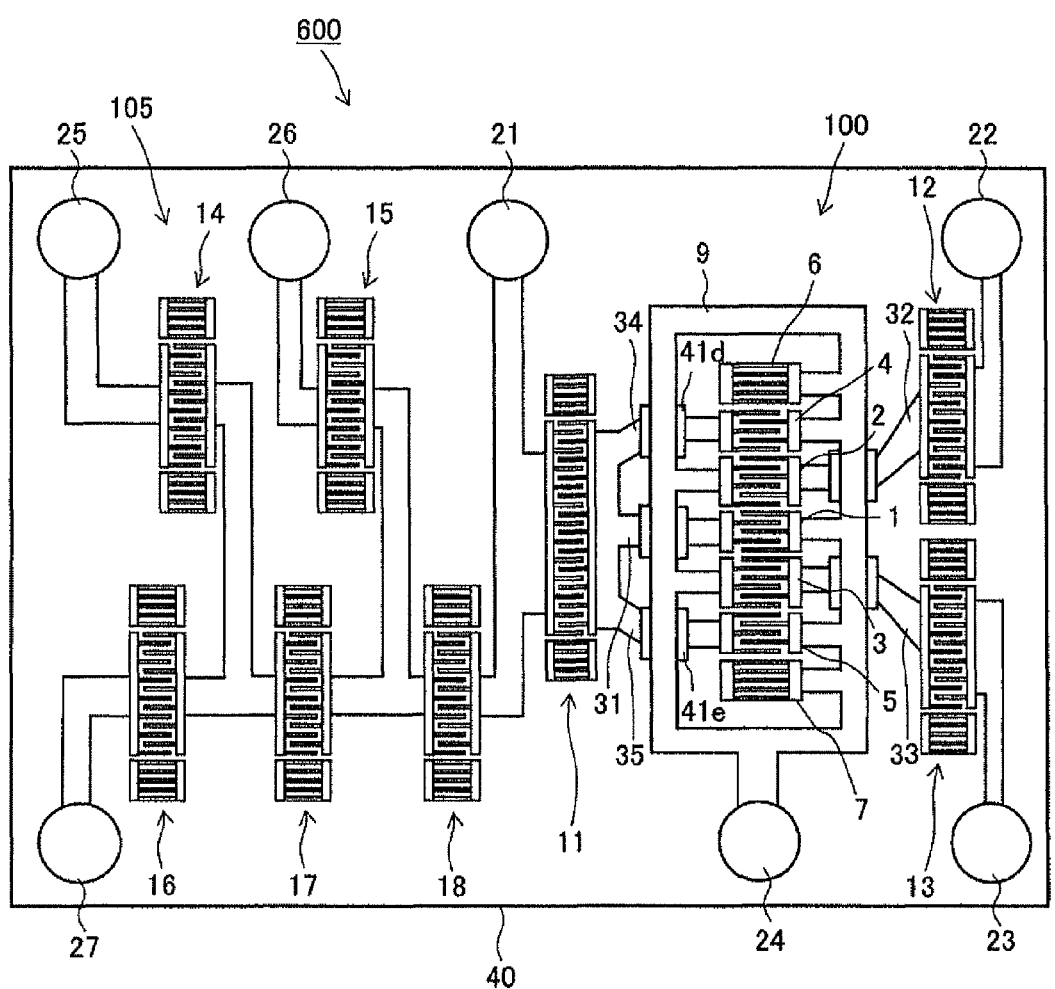
FIG. 12 A plan view of a duplexer according to the embodiment of the present invention.

The SAW filters according to the embodiments explained above are preferably used for configuring duplexers. FIG. 12 is a plan view of a duplexer 600 using the SAW filter 100. In the duplexer 600, the SAW filter 100 functions as the receiving bandwidth filter. In this case, the unbalanced signal terminal 21 functions as an antenna terminal, and the balanced signal terminals 22 and 23 function as receiving terminals.

The duplexer 600 is provided with a filter 105 functioning as the transmitting bandwidth filter as well. In the present embodiment, the filter 105 is configured by a ladder-type SAW filter and is provided with parallel-arm resonators 14 and 15 and series-arm resonators 16, 17, and 18. Note that, the parallel-arm resonator 14 is connected to the ground terminal 25, and the parallel-arm resonator 15 is connected to a ground terminal 26. Further, the series-arm resonator 16 is connected to a transmitting terminal 27, and the series-arm resonator 18 is connected to the unbalanced signal terminal 21 as an antenna terminal.

The receiving bandwidth filter of the duplexer 600 is configured by using the SAW filter 100, therefore the out-of-pass band attenuations of the signals output from the balanced signal terminals 22 and 23 can be made larger, and a duplexer which is excellent in the common mode isolation characteristic of the transmitting bandwidth demanded from the duplexer 600 can be formed. Note that, the "common mode isolation" is an indicator which represents a degree of separation of the transmitting bandwidth filter and the receiving bandwidth filter and shows to what extent the unbalanced signal of the transmitting terminal (unbalanced signal terminal) has leaked as the unbalanced signal from the receiving terminal (balanced signal terminal).

EXAMPLES

Example 1

Figure 13:
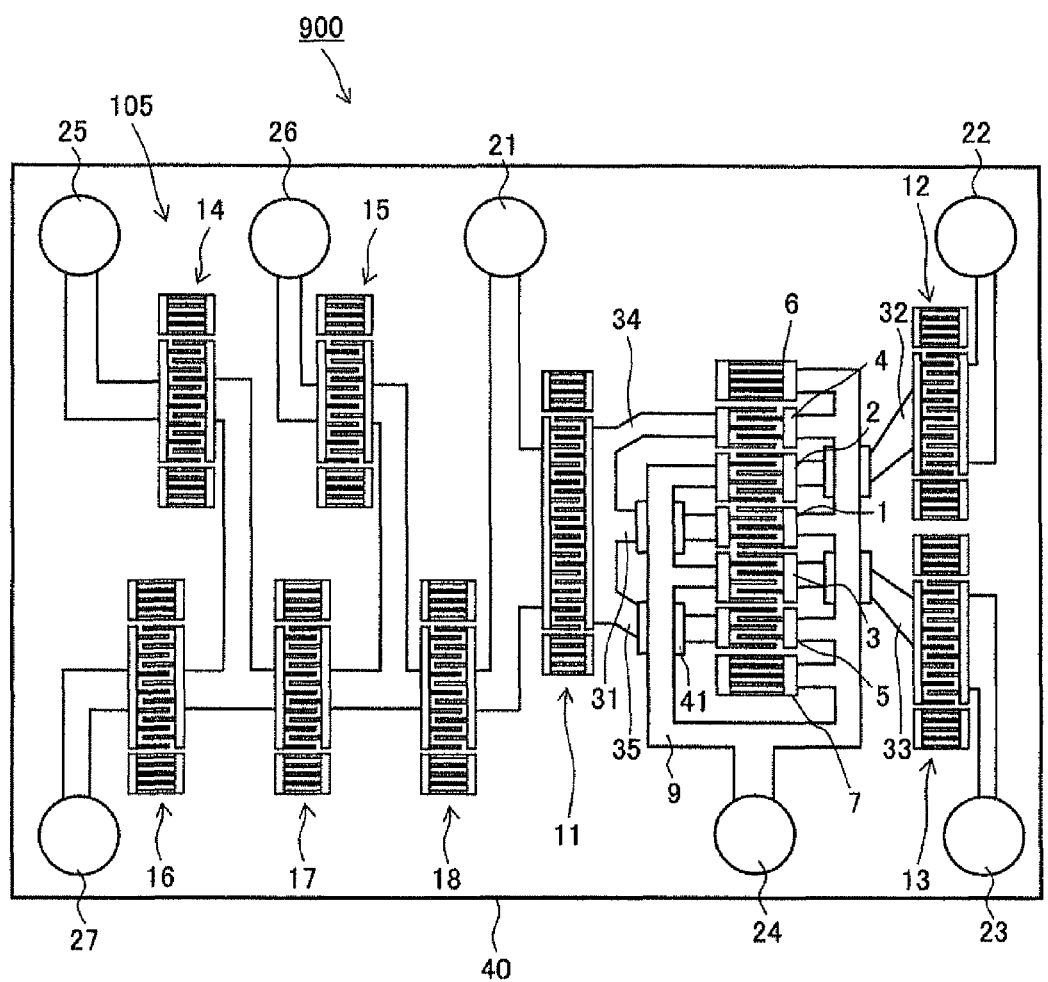
FIG. 13 A plan view showing a duplexer of Comparative Example 1.

Next, Example 1 of a duplexer according to the present invention is explained. The common mode isolation characteristics with respect to the duplexer 600 of Example 1 comprised of the structure shown in FIG. 12 and a duplexer 900 of Comparative Example 1 comprised of the structure shown in FIG. 13 were calculated by simulation.

The duplexer 900 of Comparative Example 1 differs in the shape of the reference potential line 9 compared with the duplexer 600 of Example 1. Specifically, the portion of the reference potential line 9 which was laid up to the outside of the reflector electrode 6 in the duplexer 600 of Example 1 is not laid to the outside of the reflector electrode 6 in the duplexer 600 of Comparative Example 1, but is connected at one end to the bus bar conductor of the reflector electrode 6 and is connected at the other end to the reference potential-use bus bar conductor of the IDT electrode 2. Note that, the configurations other than the reference potential line 9 are the same as those of the duplexer 600 of Example 1.

Figure 14:
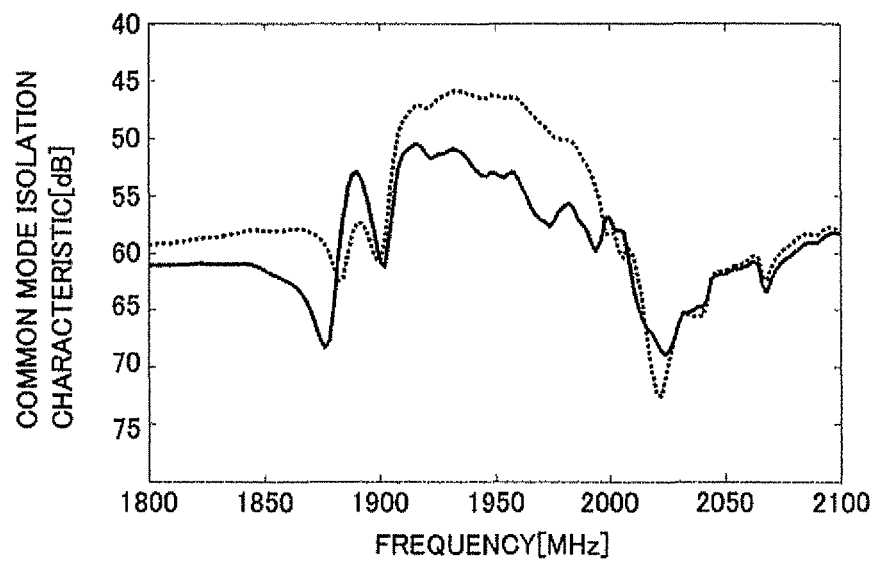
FIG. 14 A view showing common mode isolation characteristics of duplexers of Example 1 and Comparative Example 1.

FIG. 14 is a view showing results of simulation of the common mode isolation characteristics for Example 1 and Comparative Example 1. In the figure, the common mode isolation characteristic of the duplexer according to Example 1 is indicated by a solid line, while the common mode isolation characteristic of the duplexer according to Comparative Example 1 is indicated by a broken line. As shown in the same figure, the duplexer of Example 1 is improved in the common mode isolation characteristic by about 5 dB in the pass band (1920 MHz to 1980 MHz) compared with the duplexer of Comparative Example 1.

It could be confirmed from this result that the duplexer of Example 1 could be greatly improved in the common mode isolation characteristic compared with the duplexer of Comparative Example 1.

Example 2

Next, a duplexer of Example 2 is explained. The duplexer of Example 2 is one where the SAW filter 100 in the duplexer 600 shown in FIG. 12 is replaced with the SAW filter 500 shown in FIG. 10. The duplexer of Example 2 comprised of such an electrode structure was prepared and measured for the common mode isolation characteristic.

The SAW filter 500 used in the duplexer of Example 2 features the following specifications:
Intersection width of electrode fingers: 80 μm
Number of electrode fingers of the IDT electrode 1: 30
Number of electrode fingers of the IDT electrode 2: 44
Number of electrode fingers of the IDT electrode 3: 64
Number of electrode fingers of the IDT electrode 4: 42
Number of electrode fingers of the IDT electrode 5: 30
Number of electrode fingers of the reflector electrodes 6 and 7: 50
Electrode film thickness: 1600 Å
Duty: 0.55

Note that, for the material of the piezoelectric substrate 40, use was made of a 42° rotated Y-cut X-propagated $LiTaO_3$. Further, the IDT electrodes 1 to 5 and reflector electrodes 6 and 7 were formed by superimposing a layer comprised of an Al—Cu alloy on a layer comprised of Ti.

For comparison with this Example 2, the duplexer 600 of Example 1 shown in FIG. 12 was prepared. The SAW filter 100 of the duplexer of Example 1 was prepared based on the above specifications as well.

Figure 15:
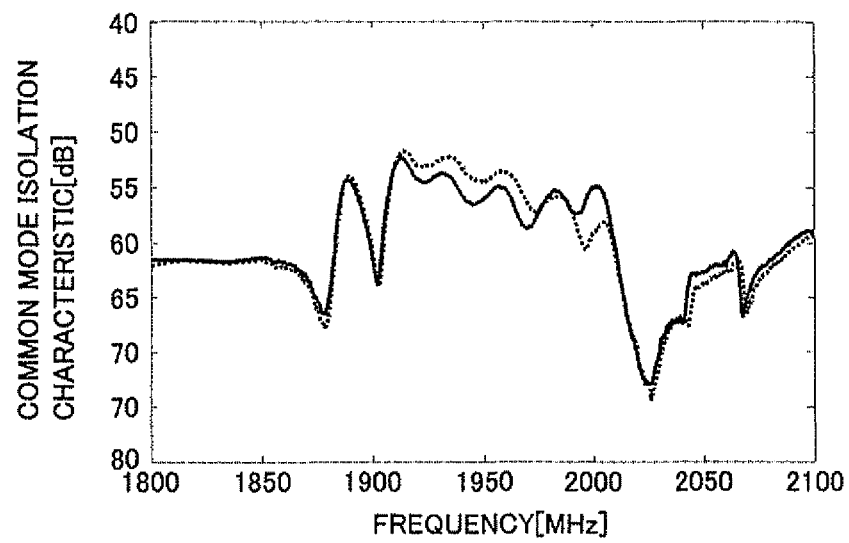
FIG. 15 A view showing common mode isolation characteristics of duplexers of Example 2 and Comparative Example 2.

The results of measurement of the common mode isolation characteristics of the duplexer of Example 2 and the duplexer of Example 1 are shown in FIG. 15. The measurement was carried out by using a network analyzer. In the figure, the result of the duplexer of Example 2 is indicated by a solid line, and the result of the duplexer of Example 1 is indicated by a broken line.

As apparent from FIG. 15, compared with the duplexer of Example 1, the common mode isolation characteristic in the pass band (1920 MHz to 1980 MHz) of the duplexer of Example 2 becomes better by about 1 dB.

It could be confirmed from this result that the common mode isolation characteristic could be improved more by employing a structure connecting the reference potential-use bus bar conductor of one IDT electrode and the reference potential-use bus bar conductor of another IDT electrode through electrode finger between adjacent IDT electrodes.

Reference Signs List

1 to 5 . . . IDT electrodes
6, 7 . . . reflector electrodes
9 . . . reference potential line
10 . . . SAW element
40 . . . piezoelectric substrate

The invention claimed is:

1. A surface acoustic wave filter, comprising:
a piezoelectric substrate;
a surface acoustic wave element comprising a first IDT electrode and a second IDT electrode which are located on the piezoelectric substrate and along a direction in which a surface acoustic wave propagates;
a first signal line electrically connected to the first IDT electrode;
a second signal line electrically connected to the second IDT electrode;
a ring-shaped reference potential line which comprises a first intersecting portion intersecting with the first signal line through a first insulation member and a second intersecting portion intersecting with the second signal line through a second insulation member and surrounds the surface acoustic wave element; and
a SAW resonator which is located at one side of the surface acoustic wave element in a direction perpendicular to the direction in which the surface acoustic wave propagates and is located outside of the ring-shaped reference potential line, wherein
the ring-shaped reference potential line touches the piezoelectric substrate between the first insulation member and the second insulation member.

2. The surface acoustic wave filter according to claim 1, wherein
the first IDT electrode comprises a first signal bus bar conductor connected to the first signal line and a first reference potential bus bar conductor electrically connected to the reference potential line, and the second IDT electrode comprises a second signal bus bar conductor connected to the second signal line and a second reference potential bus bar conductor electrically connected to the reference potential line.

3. The surface acoustic wave filter according to claim 2, further comprising a third signal line,
wherein
the surface acoustic wave element further comprises a third IDT electrode which is located along the direction and is electrically connected to the third signal line,
the reference potential line further comprises a third intersecting portion which intersects with the third signal line through a third insulation member and touches the piezoelectric substrate among the first insulation member, the second insulation member and the third insulation member,
the third IDT electrode comprises a third signal bus bar conductor connected to the third signal line and a third reference potential bus bar conductor electrically connected to the reference potential line,
the first IDT electrode is between the second IDT electrode and the third IDT electrode, and
when dividing an inside of a ring of the reference potential line into a first region and a second region along the direction, the first signal bus bar conductor, the second reference potential bus bar conductor, and the third reference potential bus bar conductor are in the first region, and the first reference potential bus bar conductor, the second signal bus bar conductor, and the third signal bus bar conductor are in the second region.

4. The surface acoustic wave filter according to claim 3, wherein the surface acoustic wave element further comprises a first reflector electrode and a second reflector electrode, the first and second reflector electrodes sandwiching the first, second, and third IDT electrodes between the two along the direction, and a portion of the ring shape of the reference potential line is formed of at least one of the first and second reflector electrodes.

5. The surface acoustic wave filter according to claim 3, further comprising an unbalanced signal terminal electrically connected to the first signal line; a first balanced signal terminal electrically connected to the second signal line; and a second balanced signal terminal electrically connected to the third signal line.

6. The surface acoustic wave filter according to claim 2, wherein the first IDT electrode further comprises a plurality of electrode fingers connected to the first reference potential bus bar conductor, and the electrode finger located at an end portion closer to the second IDT electrode among the plurality of electrode fingers is connected to the second reference potential bus bar conductor.

7. The surface acoustic wave filter according to claim 1, wherein the first IDT electrode comprises a first signal bus bar conductor connected to the first signal line, and a portion of the first insulation member is laminated on the first signal bus bar conductor.

8. The surface acoustic wave filter according to claim 1, wherein the reference potential line is made of a single material.

9. A duplexer, comprising: a transmitting filter; and a receiving filter, wherein at least one of the transmitting filter and receiving filter comprises a surface acoustic wave filter according to claim 1.

10. A surface acoustic wave filter, comprising:
a piezoelectric substrate;
a surface acoustic wave element comprising a first IDT electrode on the piezoelectric substrate;
a first signal line electrically connected to the first IDT electrode;
a ring-shaped reference potential line which comprises a first intersecting portion intersecting with the first signal line through a first insulation member and surrounds the surface acoustic wave element;
a second signal line,
wherein
the surface acoustic wave element further comprises a second IDT electrode which is located next to the first IDT electrode along a direction in which a surface acoustic wave of the surface acoustic wave element propagates, and is electrically connected to the second signal line,
the reference potential line further comprises a second intersecting portion which intersects with the second signal line through a second insulation member,
the first IDT electrode comprises a first signal bus bar conductor connected to the first signal line and a first reference potential bus bar conductor electrically connected to the reference potential line, and
the second IDT electrode comprises a second signal bus bar conductor connected to the second signal line and a second reference potential bus bar conductor electrically connected to the reference potential line;
a third signal line,
wherein
the surface acoustic wave element further comprises a third IDT electrode which is located along the direction and is electrically connected to the third signal line,
the reference potential line further comprises a third intersecting portion which intersects with the third signal line through a third insulation member,
the third IDT electrode comprises a third signal bus bar conductor connected to the third signal line and a third reference potential bus bar conductor electrically connected to the reference potential line,
the first IDT electrode is between the second IDT electrode and the third IDT electrode, and
when dividing an inside of a ring of the reference potential line into a first region and a second region along the direction, the first signal bus bar conductor, the second reference potential bus bar conductor, and the third reference potential bus bar conductor are in the first region, and the first reference potential bus bar conductor, the second signal bus bar conductor, and the third signal bus bar conductor are in the second region;
an unbalanced signal terminal electrically connected to the first signal line; a first balanced signal terminal electrically connected to the second signal line; and a second balanced signal terminal electrically connected to the third signal line; and
a branched line which is located between the second signal line and the third signal line, and is connected to the reference potential line.

11. A surface acoustic wave filter, comprising:
a piezoelectric substrate;
a surface acoustic wave element comprising
a plurality of IDT electrodes which are located on the piezoelectric substrate and along a direction in which a surface acoustic wave propagates;
a plurality of signal lines electrically connected to the plurality of IDT electrodes;

a ring-shaped reference potential line which comprises a plurality of intersecting portions intersecting with the plurality of signal lines through a plurality of insulation members and surrounds the surface acoustic wave element; and
a SAW resonator which is located at one side of the surface acoustic wave element in a direction perpendicular to the direction in which the surface acoustic wave propagates and is located outside of the ring-shaped reference potential line, wherein the plurality of insulation members include, at the one side of the surface acoustic wave element, two or more insulation members which are located along the direction in which the surface acoustic wave propagates and are separated from each other in that direction, the ring-shaped reference potential line touches the piezoelectric substrate among the two or more insulation members.

* * * * *